United States Patent
Ohmi et al.

(10) Patent No.: US 7,528,074 B2
(45) Date of Patent: May 5, 2009

(54) METHOD OF MANUFACTURING A SEMICONDUCTOR DEVICE AND METHOD OF ETCHING AN INSULATING FILM

(75) Inventors: Tadahiro Ohmi, Miyagi (JP); Tetsuya Goto, Miyagi (JP)

(73) Assignee: Foundation for Advancement of International Science, Tsukuba-Shi (JP)

( * ) Notice: Subject to any disclaimer, the term of this patent is extended or adjusted under 35 U.S.C. 154(b) by 95 days.

(21) Appl. No.: 10/588,698

(22) PCT Filed: Feb. 2, 2005

(86) PCT No.: PCT/JP2005/001513

§ 371 (c)(1),
(2), (4) Date: Aug. 8, 2006

(87) PCT Pub. No.: WO2005/076336

PCT Pub. Date: Aug. 18, 2005

(65) Prior Publication Data

US 2007/0167001 A1    Jul. 19, 2007

(30) Foreign Application Priority Data

Feb. 9, 2004    (JP)    .............................. 2004-032607

(51) Int. Cl.
*H01L 21/302*    (2006.01)
*H01L 21/461*    (2006.01)

(52) U.S. Cl. ............... 438/734; 438/714; 257/E21.249; 257/E21.252

(58) Field of Classification Search ................. 438/698, 438/734, 714; 257/E21.249, E21.25, E21.252, 257/E21.26, E21.256
See application file for complete search history.

(56) References Cited

U.S. PATENT DOCUMENTS

| | | | | |
|---|---|---|---|---|
| 6,083,845 A | * | 7/2000 | Yang et al. | 438/734 |
| 6,204,193 B1 | | 3/2001 | Jozaki | |
| 6,337,277 B1 | * | 1/2002 | Chou et al. | 438/689 |
| 6,406,640 B1 | * | 6/2002 | Yang et al. | 216/67 |
| 6,746,961 B2 | * | 6/2004 | Ni et al. | 438/700 |
| 6,780,342 B1 | * | 8/2004 | Hagihara et al. | 216/67 |

(Continued)

FOREIGN PATENT DOCUMENTS

EP    1 308 994 A1    5/2003

(Continued)

OTHER PUBLICATIONS

R. Kaihara et al., "Damage-Free Contact Etching Using Balanced Electron Drift Magnetron Etcher," The Ninth International Symposium on Semiconductor Manufacturing, Proceeding of ISSM 2000, pp. 102-103.

*Primary Examiner*—Caridad M Everhart
(74) *Attorney, Agent, or Firm*—Foley & Lardner LLP

(57) ABSTRACT

During etching of a contact hole, not only the energy of ion irradiation but also the gas composition are altered to change the etching from a high-rate etching to a low-rate etching, thereby reducing the damage. In the low-rate etching where the gas composition is also altered, a firm fluorocarbon film is formed on the bottom of the contact hole, and the etching can be carried out while protecting the silicon surface. Consequently, inactivation of the impurities doped in the silicon surface can be prevented.

22 Claims, 6 Drawing Sheets

U.S. PATENT DOCUMENTS

| | | | |
|---|---|---|---|
| 6,803,318 B1 * | 10/2004 | Qiao et al. | 438/700 |
| 6,828,251 B2 * | 12/2004 | Su et al. | 438/724 |
| 2004/0063331 A1 * | 4/2004 | Mori et al. | 438/714 |
| 2005/0118829 A1 * | 6/2005 | Lee et al. | 438/714 |
| 2005/0263487 A1 * | 12/2005 | Tsuchiya | 216/67 |

FOREIGN PATENT DOCUMENTS

| | | |
|---|---|---|
| JP | 11-307512 | 11/1999 |
| JP | 2003-188155 A | 7/2003 |
| JP | 2003-533042 A | 11/2003 |
| JP | 2003-347281 A | 12/2003 |

* cited by examiner

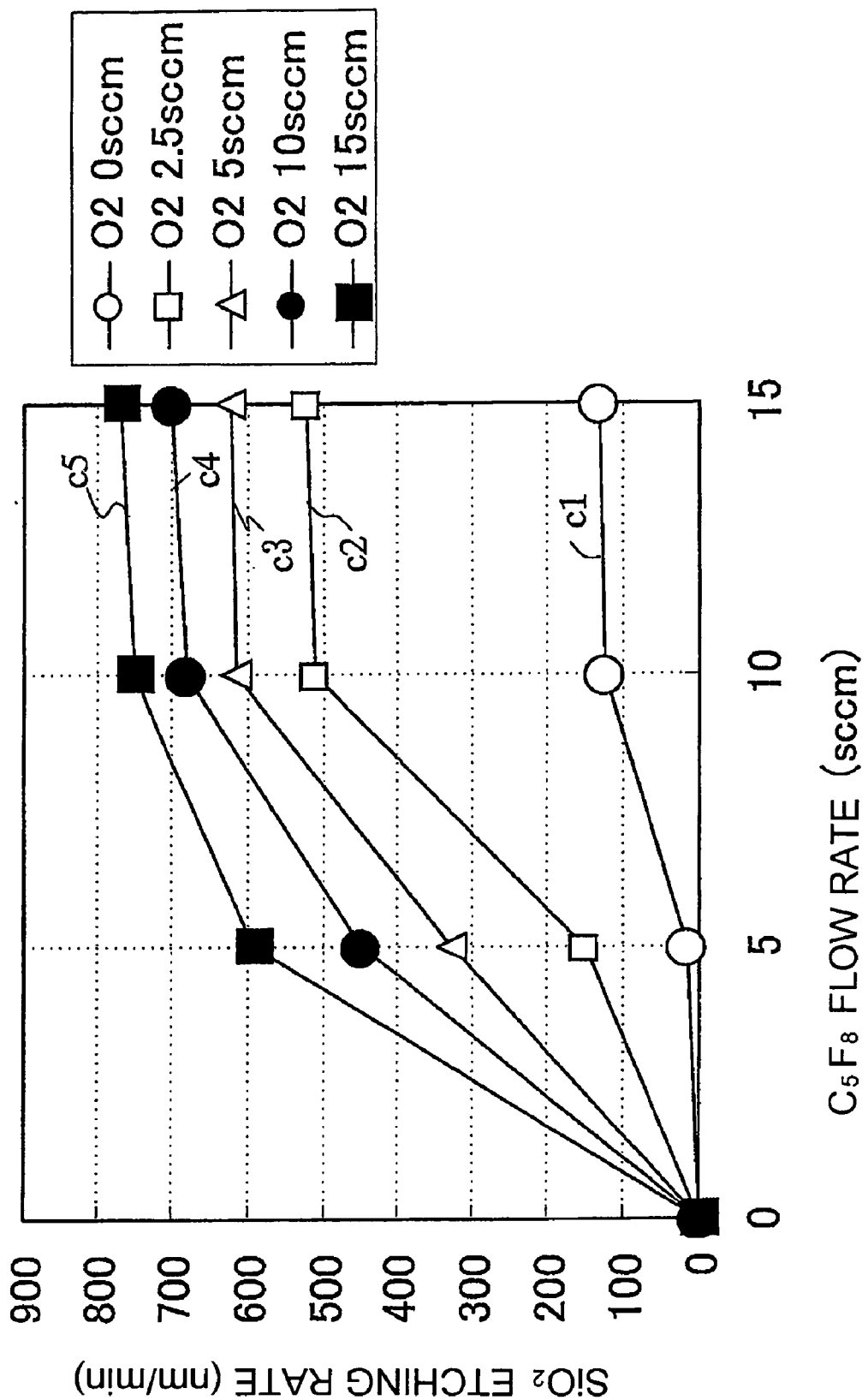
[FIG. 1]

[FIG. 2]
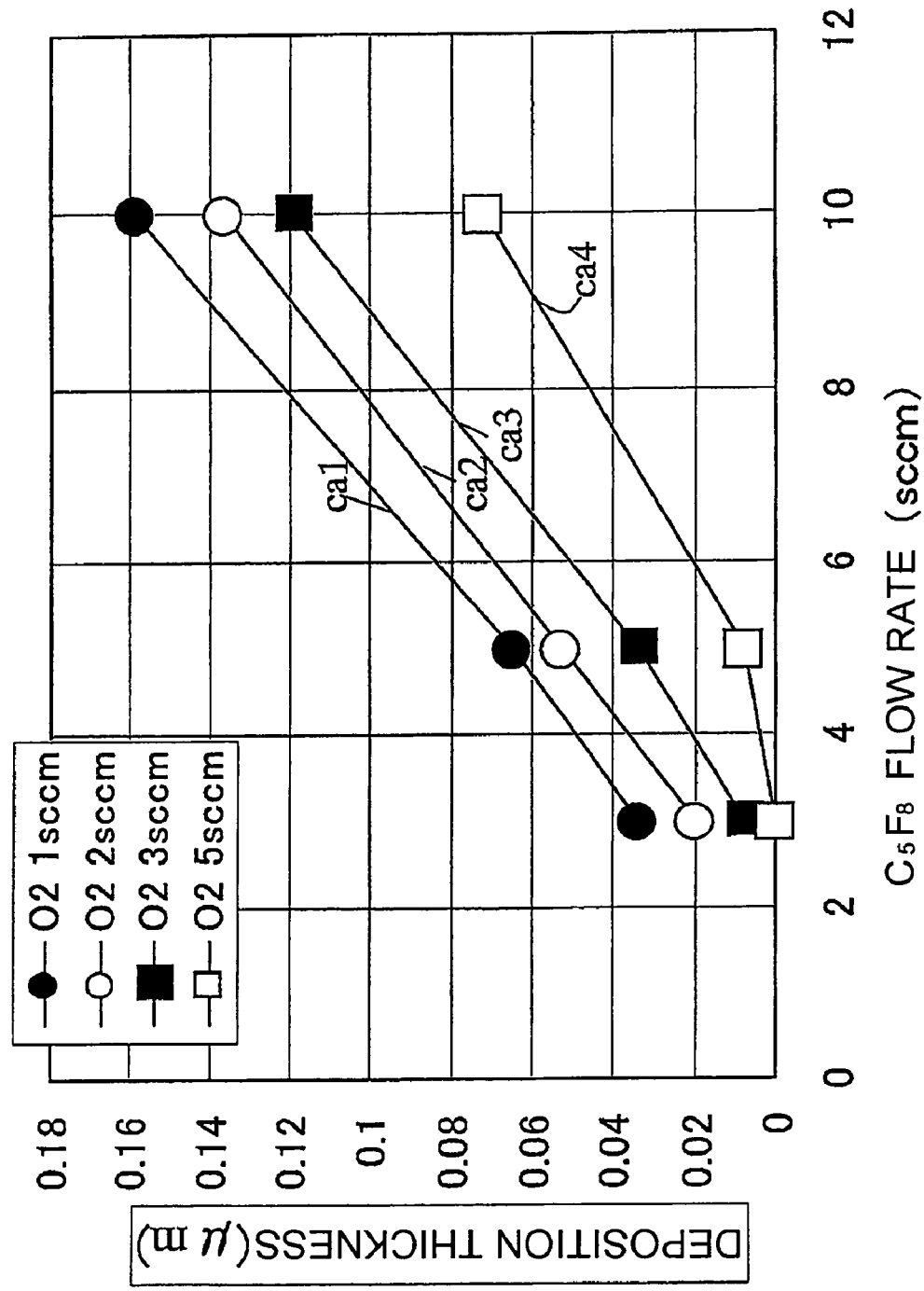

[FIG. 3]
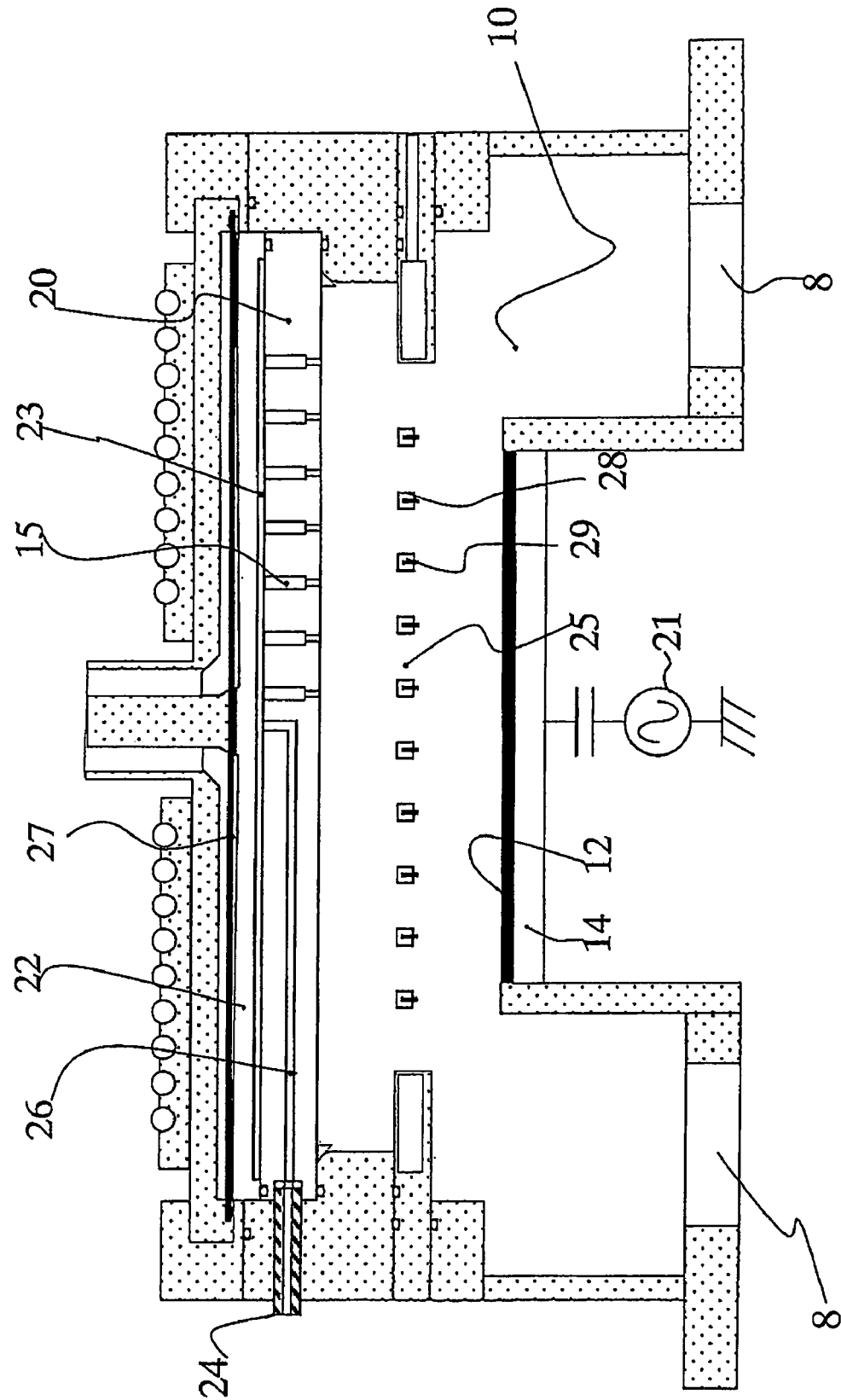

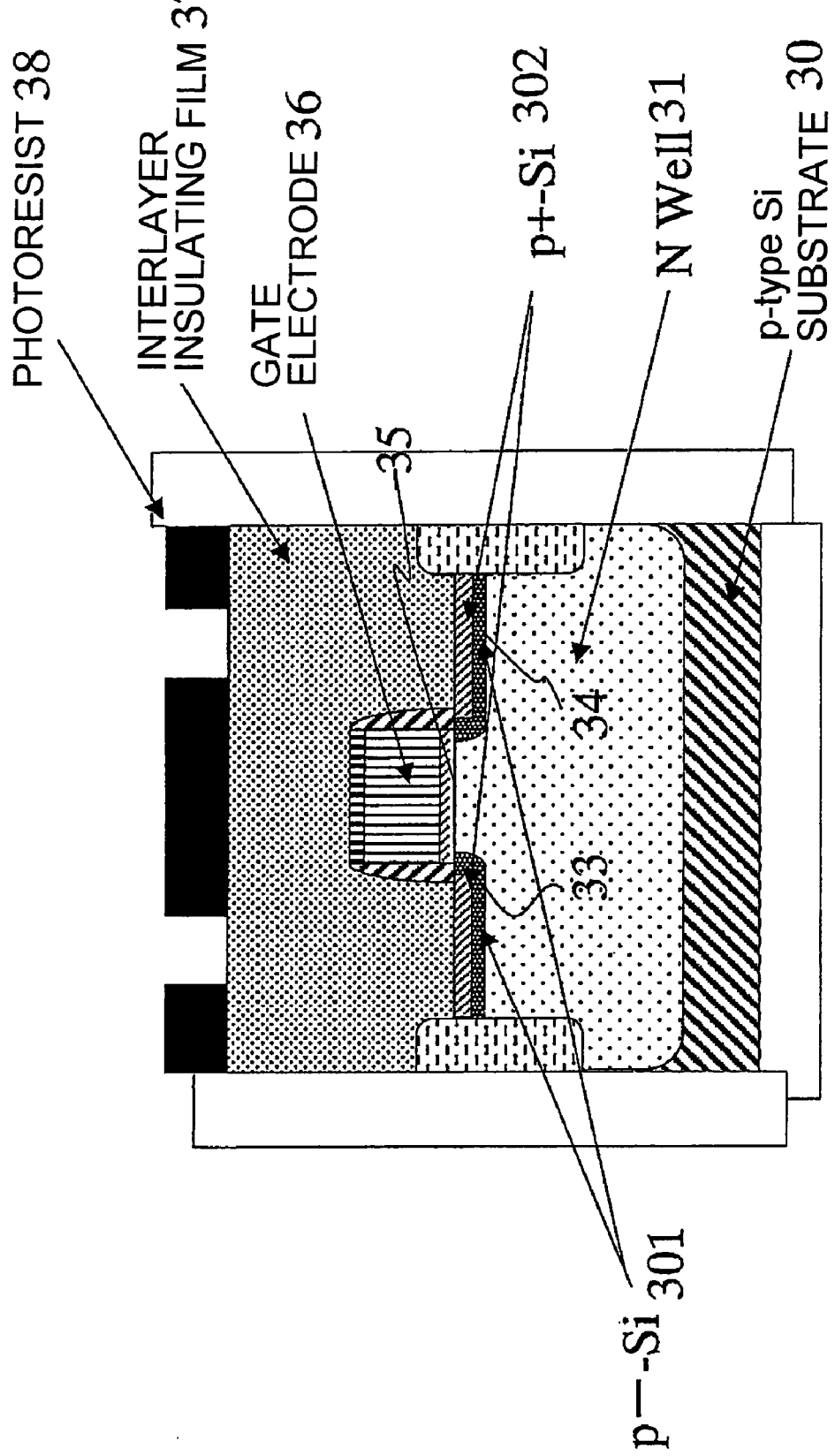
[FIG. 4]

[FIG. 5]
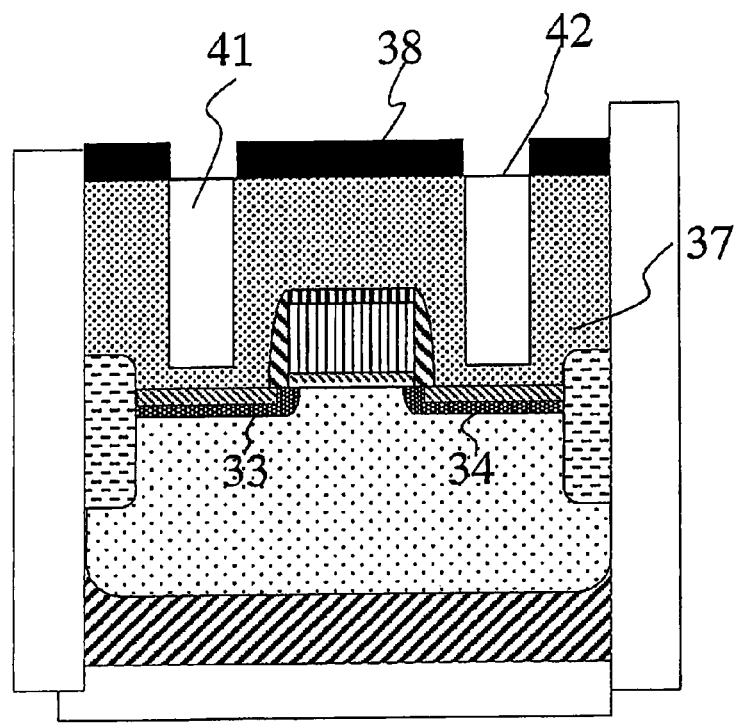
[FIG. 6]
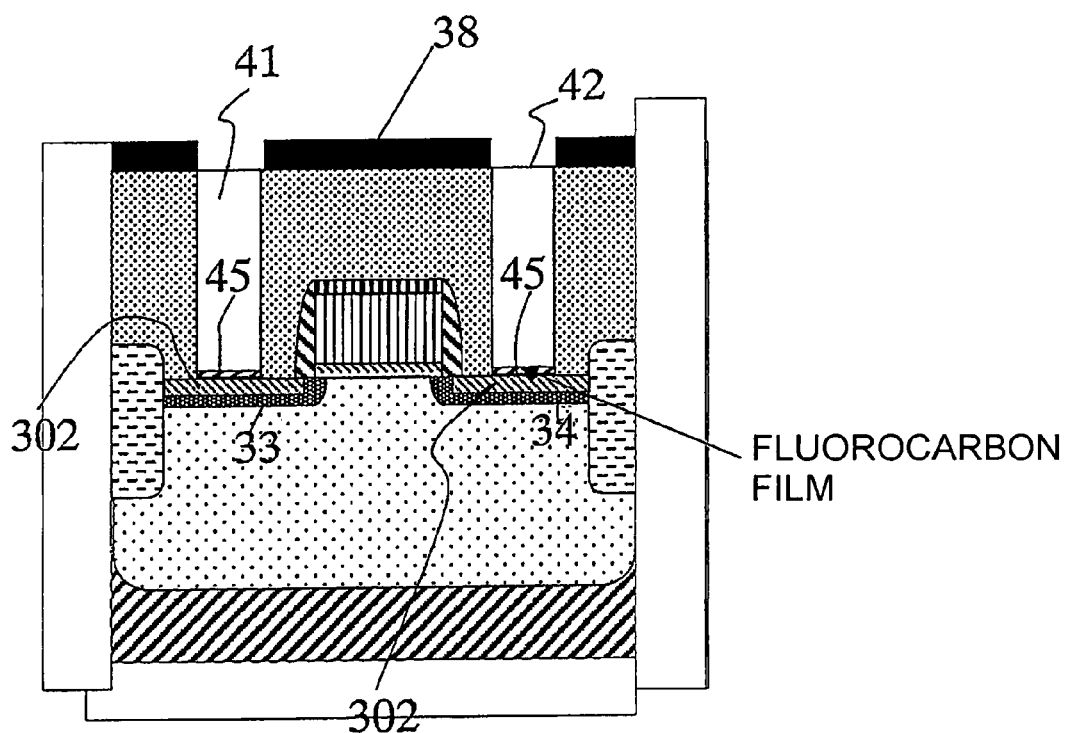

[FIG. 7]
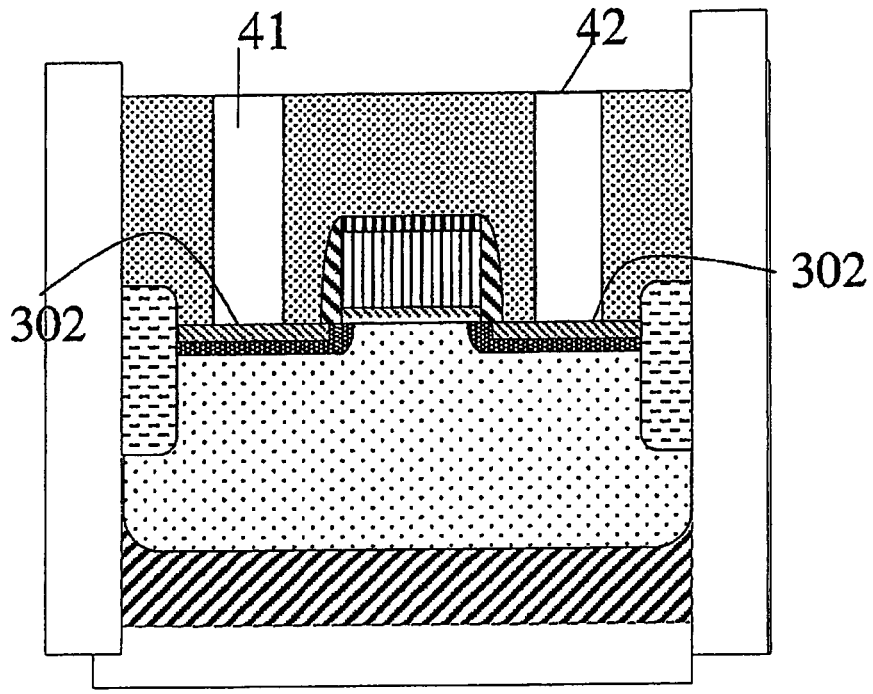
[FIG. 8]
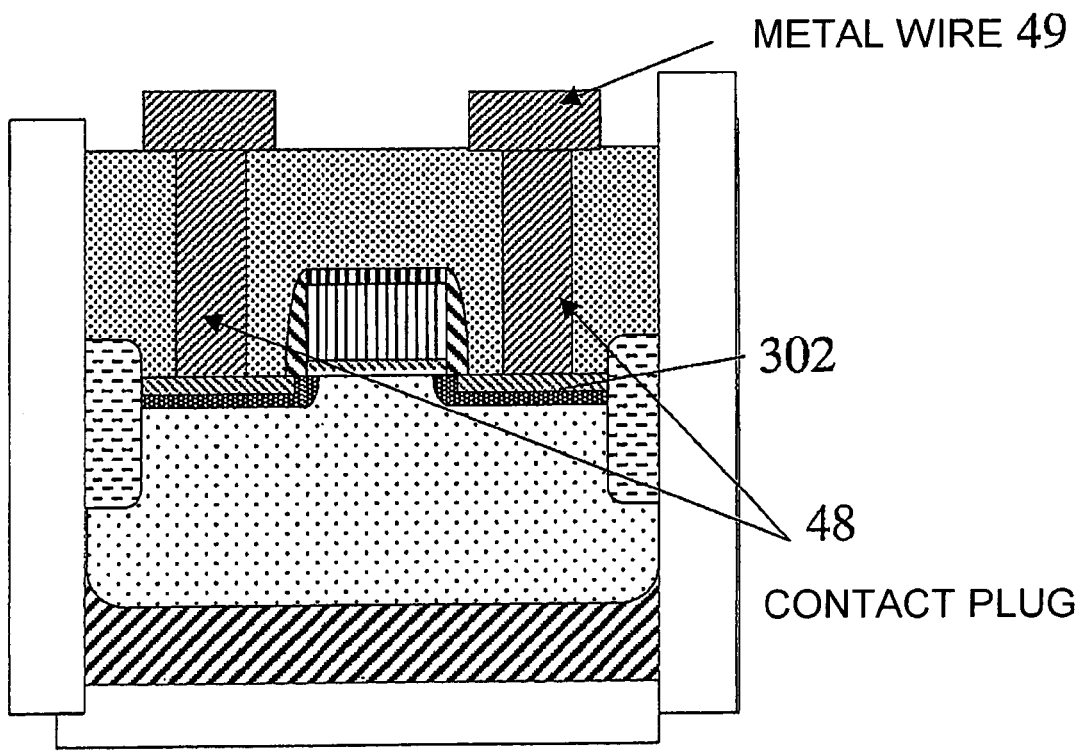

METHOD OF MANUFACTURING A SEMICONDUCTOR DEVICE AND METHOD OF ETCHING AN INSULATING FILM

TECHNICAL FIELD

This invention relates to a method of manufacturing a semiconductor device including a process of etching an insulating layer.

BACKGROUND ART

In the semiconductor device manufacturing process, etching is carried out without exception. For example, in the case of manufacturing a field-effect transistor as a semiconductor device, an insulating film such as a silicon oxide film being a material of an interlayer insulating film is formed with contact holes by reactive ion etching upon carrying out wiring to a source and a drain, and electrodes or metal wires are applied to such opened contact holes.

In this case, the contact resistance at the bottom of the contact hole increases in inverse proportion to the contact diameter if the resistivity of the underlying silicon is constant. Accordingly, as the miniaturization and integration of a semiconductor device advance more and more so that the contact diameter is further reduced, the resistivity at the contact bottom tends to increase. Particularly, in the case of forming a contact hole by normal reactive ion etching, the underlying silicon is subjected to damage when the underlying silicon is exposed upon completion of the etching of an oxide film. This is because high-energy ions are irradiated onto the underlying silicon and, as a result, impurities such as boron or phosphorus doped in the silicon are inactivated so that the resistivity of the underlying silicon increases. Particularly, since boron serving as impurities for forming a p+ layer has dangling bonds, it tends to be inactivated much more easily as compared with phosphorus or arsenic. Therefore, if this p+ layer is subjected to ion irradiation, it nearly becomes a p layer due to the inactivation. As a consequence, the resistivity of the underlying silicon increases.

In order to prevent the increase in resistivity of the underlying silicon due to the ion irradiation as described above, proposal has been made of a method of introducing a damage removal process after the etching. This method is a technique that, after contact hole etching and a resist removal process, removes by chemical dry etching a damaged layer in which carriers are inactivated, carries out ion implantation for doping impurities at high concentration again, and further carries out activation annealing.

Further, as another conventional technique for solving a problem following the increase in resistivity, damage-free two-step etching is proposed, for example, in "The Ninth International Symposium on Semiconductor Manufacturing, Proceeding of ISSM2000, pp. 102-105, Tokyo, Sep. 2000." (hereinafter referred to as Prior Art 1). According to this technique, in order to reduce ion irradiation damage to the underlying silicon and further not to increase an etching time, etching is carried out by setting a self-bias voltage (Vdc) to −500V to −600V for 90% of a contact hole while etching is carried out by setting Vdc=−150V for the remaining 10% of the contact hole. In this event, an introducing gas for use in plasma excitation is Xe, $C_4F_8$, CO, or $O_2$.

DISCLOSURE OF THE INVENTION

Problem to be Solved by the Invention

Of the two conventional solving means as described above, the method of removing the damaged layer after the etching has had a problem that causes an increase in the number of manufacturing processes amounting to several tens of processes including the impurity doping after the removal, the activation annealing, and cleaning which is carried out between them, resulting in an increase in TAT (Turn Around Time) and an increase in cost.

On the other hand, with respect to the damage-free two-step etching, it was found that various problems occur according to the study and experimentation by the present inventors wherein contact hole formation was carried out by the damage-free two-step etching using an etching gas containing carbon (C) and fluorine (F) described in Prior Art 1.

It has been found that when 90% of a contact hole is at first etched with a self-bias (Vdc) of −500 to −600V and then the remaining 10% of an oxide film is etched by setting Vdc=−150V, fluorocarbon-based radicals containing carbon with a high adhesion probability reach a side wall of the contact hole without being subjected to impact of high-energy ions and are deposited on the side wall as they are during the remaining 10% oxide film etching. It has been found that, as a result of this, an etching gas does not reach the bottom of the contact hole while radicals containing much fluorine with an adhesion probability smaller than that of carbon selectively reach the bottom of the contact hole.

Accordingly, there has been observed a phenomenon that when the underlying silicon is exposed, a strong fluorocarbon film adapted to protect the underlying silicon from the ion impact is not formed at the bottom of the contact hole.

It has been found that there is a problem that if the etching is carried out in this state, the underlying silicon is inevitably etched and therefore, the etching selectivity to the underlying silicon (oxide film etching rate/underlying silicon etching rate) cannot be ensured. Simultaneously, it has been found that the etching selectivity to a photoresist (oxide film etching rate/photoresist etching rate) is also degraded.

It is therefore an object of this invention to provide a damage-free etching process technique that does not require a damaged layer removal process and further that ensures high photoresist selectivity and high silicon selectivity.

It is another object of this invention to provide a method of manufacturing a semiconductor device and an etching method that can prevent the underlying silicon from being undesirably etched.

It is still another object of this invention to provide a method of manufacturing a semiconductor device and an etching method that can efficiently form a fluorocarbon film at the bottom of a contact hole to thereby reduce a change in resistivity at the bottom of the contact hole.

Means for Solving the Problem

According to this invention, it is provided a method of manufacturing a semiconductor device or an method of etching an insulating film including an etching step of opening a contact hole in an insulating film by reactive ion etching, the method of manufacturing a semiconductor device or the method of etching an insulating film wherein the etching step includes a first step of carrying out etching at a predetermined rate and a second step of carrying out etching at a rate lower than the rate, the second step is carried out after the first step but before an underlayer is exposed by the opening, and a gas with a composition and a supply amount which differ from at least one of a composition and a supply amount of a gas supplied in the first step is supplied in the second step.

The contact hole may be formed in the insulating film on at least one of a source region and a drain region of a field-effect transistor.

The insulating film may be a silicon oxide film.

It is preferable that the supply gas contain at least C and F and the supply amount of the supply gas be reduced in the second step as compared with that in the first step.

Alternatively, it is preferable that the supply gas contain a gas containing C and F, and oxygen ($O_2$) and a supply amount of the oxygen be reduced in the second step as compared with that in the first step or a supply amount of the gas containing C and F be reduced in the second step as compared with that in the first step, or both be reduced.

The supply gas contains a gas containing C and F, and oxygen and a composition composed of the gas containing C and F and the oxygen may be changed in the second step from that in the first step.

It is preferable that the etching be carried out for part, for example, 90%, of the final depth of the opening in the first step and the second step be carried out thereafter. However, the switching depth may be 80% to 95% and may be determined in consideration of the total etching time (the second step takes more time), the thickness of a deposit on the wall surface (more difficult to adhere in the second step), the protection of the surface of the underlayer, and so on. Essentially, switching to the second step is carried out before the completion of the etching, i.e. before the exposure of the surface of the underlayer.

The reactive ion etching is preferably carried out by a microwave-excited plasma processing apparatus and the power of plasma excitation is reduced in the second step as compared with that in the first step.

The composition and supply amount of the gas supplied in the second step are preferably selected so that the thickness of a deposit on a side wall of the opening becomes 10% or less of the diameter of the opening. Further, the composition and supply amount of the gas supplied in the second step are preferably selected so that a protective film is formed on the surface of the underlayer at the opening. This protective film formed on the surface of the underlayer is preferably a fluorocarbon film.

Alternatively, this invention provides a method of manufacturing a semiconductor device or an etching method including a step of carrying out etching by the use of a gas, the method of manufacturing a semiconductor device or the etching method characterized by changing at least one of a composition and a flow rate of the gas during the etching and finishing the etching in the state where the surface of an underlayer is protected.

The etching by the gas of which the at least one of the composition and flow rate is changed can prevent inactivation of boron on the surface of the underlayer.

In this invention, upon forming a contact hole by reactive ion etching, a strong fluorocarbon film can be formed at the bottom of the contact hole. As a result, it is possible to prevent inactivation of doped impurities due to excessive exposure of silicon to ions at the bottom of the contact hole and thus also prevent an increase in resistance due to inactivation of the impurities.

BRIEF DESCRIPTION OF THE DRAWINGS

FIG. 1 is a graph showing the relationships between the oxide film etching rate and the $C_5F_8$ gas flow rate when the additive $O_2$ flow rates are 0 sccm, 2.5 sccm, 5 sccm, 10 sccm, and 15 sccm.

FIG. 2 is a graph showing the relationships between the fluorocarbon film deposition amount on a side wall of a contact hole and the $C_5F_8$ flow rate when the additive $O_2$ flow rates are 1 sccm, 2 sccm, 3 sccm, and 5 sccm.

FIG. 3 is a sectional view showing a schematic structure of a microwave-excited plasma processing apparatus with two-stage shower plate structure using a radial line slot antenna.

FIG. 4 is a sectional view showing the state of a field-effect transistor, before etching, according to Example 1 of this invention.

FIG. 5 is a sectional view showing the state of the field-effect transistor, after a first etching process, according to Example 1 of this invention.

FIG. 6 is a sectional view showing the state of the field-effect transistor during the manufacture, after a second etching process (damage-free etching), according to Example 1 of this invention.

FIG. 7 is a sectional view showing the state of the field-effect transistor during the manufacture, after ashing, according to Example 1 of this invention.

FIG. 8 is a sectional view of the field-effect transistor obtained by a manufacturing method according to Example 1 of this invention.

BEST MODE FOR CARRYING OUT THE INVENTION

At first, the principle of this invention will be described in order to facilitate understanding of this invention.

Referring to FIG. 1, there are shown the relationships between the etching rate of a silicon oxide film and the $C_5F_8$ flow rate in a high-rate etching mode (Vdc=−550V). There is shown the etching rate (nm/min) of the silicon oxide film while adding oxygen ($O_2$) as an additive gas to $C_5F_8$ and changing the $O_2$ flow rate and the $C_5F_8$ flow rate. In the example of the figure, the relationships between the $C_5F_8$ flow rate and the etching rate when the $O_2$ flow rate is changed from 0 sccm to 2.5, 5, 10, and 15 sccm are shown by curves c1 to c5, respectively. Herein, 1 sccm represents a flow rate at which 1 cm$^3$ of a gas in the standard state flows per minute.

As clear from the curve c4, in order to carry out high-rate etching with the etching rate being approximately 700 nm/min or more, the $C_5F_8$ flow rate is required to be 10 sccm or more in the case of $O_2$=10 sccm. On the other hand, as shown by the curve c5, the $C_5F_8$ flow rate is required to be 8 sccm or more in the case of $O_2$=15 sccm. However, since it has been found that the selectivity to a photoresist is degraded when the $O_2$ flow rate exceeds approximately 10 sccm, the high-rate etching may be carried out by setting approximately $C_5F_8$=10 sccm and $O_2$=10 sccm.

The present inventors carried out high-rate etching for 90% of a contact hole under the foregoing conditions and then carried out etching for the remaining 10% of the contact hole under the conditions different from the high-rate etching. In this manner, it was possible to prevent the underlying silicon from being damaged.

At first, before describing the processes of this invention, the etching was carried out by reducing an absolute value of the self-bias voltage, in the high-rate etching conditions, to 200V (Vdc=−200V), as described in the foregoing Prior Art 1. In this case, fluorocarbon-based radicals containing carbon with a high adhesion probability, that reached a side wall of the contact hole, were deposited on the side wall as they were without being subjected to impact of high-energy ions. As a result, an etching gas did not reach the bottom of the contact hole. Therefore, radicals containing much F with an adhesion probability smaller than that of C selectively reach the bottom of the contact hole. Thus, when the underlying silicon is exposed, a strong fluorocarbon film adapted to protect the underlying silicon from the ion impact is not formed.

It has been found that if the etching is carried out in the state where no strong fluorocarbon film is formed, the underlying silicon is also etched so that the etching selectivity to the underlying silicon (oxide film etching rate/underlying silicon etching rate) cannot be ensured. Simultaneously, it has also been found that when the $C_5F_8$ flow rate is reduced, the deposition of the fluorocarbon film on the side wall is also reduced.

In view of this, the present inventors discussed a technique for adhering a strong fluorocarbon film at the bottom of a contact hole and have found that, in order to adhere the fluorocarbon film at the bottom of the contact hole, it is necessary not only to merely change the self-bias, but also to change the composition and flow rate of a supply gas.

Taking this into account, the composition and flow rate of a supply gas are selected so that the thickness of a deposit such as a fluorocarbon film on the side wall does not exceed approximately 10% of the diameter of the contact hole. Alternatively, the composition and flow rate of a supply gas are selected so that a protective film such as a fluorocarbon film adheres at the bottom of the contact hole.

Referring to FIG. 2, there are shown the relationships between the deposition rate of a fluorocarbon film on a side wall of a contact hole having a diameter of 0.35 μm and the $C_5F_8$ flow rate when Vdc=−200V. FIG. 2 shows the relationships between the $C_5F_8$ flow rate and the fluorocarbon deposition thickness (μm) when the $O_2$ flow rates added to $C_5F_8$ are 1 sccm, 2 sccm, 3 sccm, and 5 sccm (graphs ca1, ca2, ca3, and ca4, respectively). The etching time is a time required for etching the contact hole remainder (approximately 10 nm). It has been found that when the thickness of the deposit on the side wall is 0.04 μm or less, i.e. is approximately 10% or less of the contact hole diameter, radicals with a large ratio of carbon sufficiently reach the bottom of the contact hole so that a fluorocarbon film is formed at the bottom of the contact hole to protect the underlying silicon from the ion impact.

Specifically, in FIG. 2, the deposition thickness can be made 0.04 μm or less by setting the $C_5F_8$ flow rate to 6 sccm or less and the $O_2$ flow rate to 3 to 5 sccm (graphs ca3 and ca4). Further, if the $C_5F_8$ flow rate is set to 4 sccm or less, the fluorocarbon deposition thickness can be made 0.04 μm or less by changing the $O_2$ flow rate within the range of 1 to 5 sccm (graphs ca1 to ca4). Therefore, by carrying out the low-rate etching with the composition of the supply gas changed after carrying out the high-rate etching, it is possible to cover the bottom of the contact hole with the strong fluorocarbon film.

To summarize the foregoing results, after carrying out the high-rate etching by setting the $C_5F_8$ flow rate to 10 sccm and the $O_2$ flow rate to approximately 10 sccm so as not to degrade the resist selectivity, the damage-free etching is carried out. It has been made clear that this damage-free etching can be realized by reducing the $C_5F_8$ flow rate so as to suppress the side wall deposition and, further, also reducing the $O_2$ flow rate so as to protect the underlying silicon. According to this technique, the contact hole etching can be carried out without extremely increasing the etching time and without occurrence of damage. As described above, in the damage-free etching, it is necessary not only to change the self-bias voltage that determines the ion energy, but also to change the gas composition (flow rate) simultaneously.

Hereinbelow, an embodiment of this invention will be described with reference to the drawings.

FIG. 3 shows a schematic structure of a microwave plasma processing apparatus for Reactive Ion Etching (RIE) process for use in an Example of this invention.

The microwave plasma processing apparatus has a process chamber 10 that is evacuated through a plurality of exhaust ports 8. In the process chamber 10, a holding platform 14 for holding a processing substrate 12 is provided. In order to realize uniform evacuation of the process chamber 10, a space is formed in a ring shape around the holding platform 14 and the plurality of exhaust ports 8 are arranged at regular intervals, i.e. axisymmetrically to the processing substrate 12, so as to communicate with the space. Thereby, the process chamber 10 can be uniformly evacuated through the foregoing space and exhaust ports 8.

At the upper portion in the process chamber 10, a plate-shaped shower plate 20 made of a low-loss dielectric and formed with a number of opening portions (gas ejection openings) 15 is provided, as part of an outer wall of the process chamber 10, through a seal ring at a position corresponding to the processing substrate 12 on the holding platform 14. Further, a cover plate 22 made of, similarly, a low-loss dielectric is provided through another seal ring on the outer side of the shower plate 20, i.e. on the side opposite to the processing substrate 12.

A space 23 for filling a plasma excitation gas therein is formed on an upper surface of the shower plate 20 and the plurality of opening portions 15 are each formed so as to communicate with the space 23 forming a plasma gas passage. Further, inside the shower plate 20 is formed a plasma gas supply passage 26 communicating with a plasma gas supply port 24 provided in the outer wall of the process chamber 10. The plasma excitation gas such as Ar or Kr supplied to the plasma gas supply port 24 is supplied to the opening portions 15 from the supply passage 26 through the space 23 and introduced into the process chamber 10.

In the illustrated plasma processing apparatus, a shower head 28 made of a conductor is provided between the shower plate 20 and the processing substrate 12 in the process chamber 10. This is also called a lower-stage shower plate and, in this case, the shower plate 20 at the upper portion is called an upper-stage shower plate. A process gas (e.g. a gas containing $C_5F_8$ and $O_2$) is introduced into the inside of the lower-stage shower plate 28 from a non-illustrated external process gas supply system and ejected into a lower space, i.e. a space between the lower-stage shower plate 28 and the processing substrate 12, through a number of nozzles or gas ejection openings 29 provided at a lower portion of the lower-stage shower plate 28. The lower-stage shower plate 28 is provided with a number of openings 25 between the nozzles 29 and a plasma formed in a space between the upper-stage shower plate 20 and the lower-stage shower plate 28 is diffused over the surface of the processing substrate 12 through the openings 25.

The process gas ejected toward the processing substrate 12 from the nozzles 29 of the lower-stage shower plate 28 is excited by the foregoing plasma on the processing substrate 12 so that etching of the processing substrate 12 is carried out. The plasma excitation gas from the upper-stage shower plate 20 flows toward the space between the lower-stage shower plate 28 and the processing substrate 12 from the space between the upper-stage shower plate 20 and the lower-stage shower plate 28. Accordingly, the process gas is suppressed from flowing into the space between the lower-stage shower plate 28 and the processing substrate 12 and thus is prevented from occurrence of unnecessary dissociation caused by exposure to the high-density plasma there.

EXAMPLE 1

This Example 1 is an example in which this invention is applied to the manufacture of a P-channel field-effect transistor shown in FIG. 4.

Specifically, the illustrated P-channel field-effect transistor has a photoresist 38 formed with a resist pattern at regions where a source contact hole and a drain contact hole should be respectively formed in an insulating film 37 formed on the surface. Specifically, the illustrated P-channel field-effect transistor comprises source and drain regions 33 and 34 formed in an N well 31 formed on a p-type silicon substrate 30. The illustrated source region 33 and drain region 34 each have a two-layer structure of a p– silicon region 301 and a p+ silicon region 302 and a gate insulating film 35 is provided between the source region 33 and the drain region 34. A gate electrode 36 is formed on the gate insulating film 35. In this example, side surfaces and an upper surface of the gate electrode 36 are coated with an insulating film. Further, the source region 33, the drain region 34, and the gate electrode 36 are coated with the interlayer insulating film 37 such as a silicon oxide film and the photoresist 38 having openings at portions corresponding to the source region 33 and the drain region 34 is formed on the interlayer insulating film 37.

The silicon wafer 30 formed with many P-channel field-effect transistors each having the foregoing structure during the manufacture was placed on the holding platform 14 as the processing substrate 12 in FIG. 3. The p+ silicon 302 of each of the source region 33 and the drain region 34 had a carrier concentration of $2 \times 10^{20}$ cm$^{-3}$. The interlayer insulating film 37 was in the form of a silicon oxide film and had a thickness of 1 μm.

Referring also to FIG. 3, after placing the wafer (30 in FIG. 4) 12 on the holding platform 14, an Ar gas for plasma excitation was introduced at 460 sccm through the upper-stage shower plate 20 and Ar, $C_5F_8$, and $O_2$ were introduced at 40 sccm, 10 sccm, and 10 sccm, respectively, through the lower-stage shower plate 28. In this manner, the pressure was set to 40 m Torr.

Then, a microwave having a frequency of 2.45 GHz was fed to a radial line slot antenna 27 shown in FIG. 3 from a non-illustrated microwave oscillator to thereby excite a plasma. Then, an RF power of 500 W was applied to the holding platform 14 from an RF power supply 21 connected to the holding platform 14 to produce a self-bias voltage of approximately 550V in absolute value so that etching is carried out in the high-rate etching mode.

The frequency of the RF power was 2 MHz in this Example 1, but is not limited thereto and, for example, 450 kHz or 13.56 MHz may be used. The etching rate of the silicon oxide film was 700 nm/min. The etching rate can be increased by increasing the microwave power or increasing the RF power.

As a result of carrying out the etching for 77 seconds under the foregoing conditions, the interlayer insulating film 37 in the form of the silicon oxide film was selectively etched so that contact holes 41 and 42 were partly formed over the source region 33 and the drain region 34, respectively, as shown in FIG. 5. When, as illustrated, the contact holes 41 and 42 were each partly formed so that the remaining depth to the surface of the source region 33 or the drain region 34 became 10 nm, damage-free etching according to this invention was carried out. That is, the composition of the process gas supplied from the lower-stage shower plate 28 was changed from the foregoing composition to Ar, $C_5F_8$, and $O_2$ being 40 sccm, 5 sccm, and 3 sccm, respectively. Simultaneously, the RF power was reduced to change the self-bias voltage to 200V in absolute value.

Under this circumstance, the damage-free etching was carried out for 120 seconds to open the contact holes 41 and 42 (see FIG. 6). In this event, as shown in FIG. 6, a fluorocarbon film 45 containing much carbon was formed at the bottom of each of the contact holes 41 and 42, i.e. on the p+ silicon 302 to thereby prevent boron serving as carriers of the p+ silicon 302 from being inactivated due to the ion irradiation.

Then, by supplying the Ar gas at 660 sccm from the upper-stage shower plate 20, supplying Ar and $O_2$ at 40 sccm and 10 sccm, respectively, from the lower-stage shower plate 28, setting the pressure in the process chamber 10 to 133 Pa, and supplying a microwave at 2 kW to the radial line slot antenna 27 to excite a plasma for 30 seconds, the photoresist 38, the fluorocarbon films 45, and non-illustrated fluorocarbon films slightly deposited in side walls of the contact holes were removed (see FIG. 7).

During this process, the fluorocarbon films 45 deposited on the surfaces of the p+ silicon 302 are also removed and, after the removal, the surfaces of the p+ silicon 302 are directly exposed to the plasma. However, since the plasma irradiated in this event has a low electron temperature of 1 eV or less, boron is not dislocated from lattice positions so as to be inactivated. Then, shifting to a cleaning process and a wiring process, contact plugs 48 were formed in the contact holes 41 and 42 and metal wires 49 were further formed thereon. In this manner, a p-channel MOSFET was produced (see FIG. 8).

With respect to the p-channel insulating gate field-effect transistor thus produced, although there was no damage removal process, it was able to maintain the carrier concentration of the p+ silicon 302 at the bottom of each of the contact holes 41 and 42 at approximately $2 \times 10^{20}$ cm$^{-3}$. This means that the insulating gate field-effect transistor having the low-resistance source and drain was realized. In this Example, there was shown the manufacturing method of the p-channel field-effect transistor. However, it goes without saying that this invention is not limited thereto and is also effective in other semiconductor devices where wiring is carried out by the use of contact holes.

Further, since the optimum gas flow rate changes depending on the pumping speed of a pump and the residence time of a gas, the effect of this invention is not limited to the foregoing gas flow rates.

INDUSTRIAL APPLICABILITY

This invention is applicable not only to the manufacture of merely p-channel field-effect transistors, but also to other semiconductor devices (including TFTs of liquid crystal display devices and so on) in which electrode connection or wiring is carried out by the use of contact holes. Further, this invention is also applicable to the manufacture of semiconductor substrates, flat panel display active matrix substrates, and so on.

In the foregoing Example, the description has been made of only the etching gas using $C_5F_8$. However, this invention is similarly applicable even when various fluorocarbon gases are each used or other etching gases are each used.

The invention claimed is:

1. A method of manufacturing a semiconductor device, comprising an etching step of forming an opening in an insulating film by reactive ion etching;

wherein the opening is a contact hole;
wherein said etching step includes a first step of carrying out etching at a predetermined etching rate and a second step of carrying out etching at a rate lower than said predetermined etching rate;
wherein said second step is carried out after said first step is carried out and before an underlayer is exposed by the opening, and a gas with a composition and a supply amount is supplied in said second step, at least one of said composition and said supply amount of said gas being different from a composition and a supply amount of a gas supplied in said first step; and
wherein the composition and supply amount of the gas supplied in said second step are selected in such a way that a protective film is formed on a surface of the underlayer in said opening.

2. A semiconductor device manufacturing method according to claim 1, wherein:
said contact hole is formed in the insulating film on at least one of a source region and a drain region of a field-effect transistor.

3. A semiconductor device manufacturing method according to claim 1, wherein:
said insulating film is a silicon oxide film.

4. A semiconductor device manufacturing method according to claim 1, wherein:
said supply gas contains at least C and F and the supply amount of said supply gas is reduced in said second step as compared with that in said first step.

5. A method of manufacturing a semiconductor device according to claim 1, wherein:
said supply gas contains oxygen and a gas containing C and F, and a supply amount of said oxygen is reduced in said second step as compared with that in said first step.

6. A method of manufacturing a semiconductor device according to claim 1, wherein:
said supply gas contains oxygen and a gas containing C and F, and a supply amount of said gas containing C and F is reduced in said second step as compared with that in said first step.

7. A method of manufacturing a semiconductor device according to claim 1, wherein:
said supply gas contains oxygen and a gas containing C and F, and a composition of said oxygen and said gas containing C and F is changed in said second step from that in said first step.

8. A method of manufacturing a semiconductor device according to claim 1, wherein:
the etching is carried out until 80% to 95% of a predetermined depth of said opening in said first step and thereafter said second step is carried out.

9. A method of manufacturing a semiconductor device according to claim 1, wherein:
said reactive ion etching is carried out in a microwave-excited plasma processing apparatus and a power for plasma excitation is reduced in said second step as compared with that in said first step.

10. A method of manufacturing a semiconductor device according to claim 1, wherein:
the composition and supply amount of the gas supplied in said second step are selected so that a thickness of a deposit on a side wall of said opening becomes 10% or less of a diameter of said opening.

11. A method of manufacturing a semiconductor device according to claim 1, wherein:
said protective film formed on the surface of the underlayer comprises a fluorocarbon film.

12. A semiconductor device manufacturing method according to claim 1, further comprising a third step for removing the protective film formed on the surface of the underlayer, wherein a gas with a composition and a supply amount is supplied in said third step, at least one of said composition and said supply amount of said gas being different from the composition and the supply amount of the gas supplied in said second step.

13. A method of etching an insulating film for forming an opening in the insulating film by reactive ion etching, wherein:
said etching includes a first step of carrying out etching at a predetermined rate and a second step of carrying out etching at a rate slower than said rate, and said second step is carried out after said first step is carried out and before an underlayer is exposed by said opening;
wherein a gas with a composition and a supply amount is supplied in said second step, at least one of said composition and said supply amount being different from a composition and a supply amount of a gas supplied in said first step; and
wherein the composition and supply amount of the gas supplied in said second step are selected in such a way that a protective film is formed on a surface of the underlayer in said opening.

14. A method of etching an insulating film according to claim 13, wherein:
said insulating film is a silicon oxide film.

15. A method of etching an insulating film according to claim 13, wherein:
said supply gas contains at least C and F and the supply amount of said supply gas is reduced in said second step as compared with that in said first step.

16. A method of etching an insulating film according to claim 13, wherein:
said supply gas contains oxygen and gas containing C and F, and a supply amount of said oxygen is reduced in said second step as compared with that in said first step.

17. A method of etching an insulating film according to claim 13, wherein:
said supply gas contains oxygen and gas containing C and F, and a supply amount of said gas containing C and F is reduced in said second step as compared with that in said first step.

18. A method of etching an insulating film according to claim 13, wherein:
said supply gas contains oxygen and gas containing C and F, and a composition of said oxygen and said gas containing C and F is changed in said second step from that in said first step.

19. A method of etching an insulating film according to claim 13, wherein:
the etching is carried out till 80% to 95% of a predetermined depth of said opening in said first step and thereafter said second step is carried out.

20. A method of etching an insulating film according to claim 13, wherein:
said reactive ion etching is carried out in a microwave-excited plasma processing apparatus and a power for plasma excitation is reduced in said second step as compared with that in said first step.

21. A method of etching an insulating film according to claim 13, wherein:
the composition and supply amount of the gas supplied in said second step are selected so that a thickness of a deposit on a side wall of said opening becomes 10% or less of a diameter of said opening.

22. A semiconductor device manufacturing method according to claim 13, further comprising a third step for removing the protective film formed on the surface of the underlayer, wherein a gas with a composition and a supply amount is supplied in said third step, at least one of said composition and said supply amount of said gas being different from the composition and the supply amount of the gas supplied in said second step.

* * * * *